United States Patent [19]

Sibigtroth

[11] Patent Number: 4,580,246

[45] Date of Patent: Apr. 1, 1986

[54] WRITE PROTECTION CIRCUIT AND METHOD FOR A CONTROL REGISTER

[75] Inventor: James M. Sibigtroth, Austin, Tex.

[73] Assignee: Motorola, Inc., Schaumburg, Ill.

[21] Appl. No.: 548,171

[22] Filed: Nov. 2, 1983

[51] Int. Cl.[4] ............................................... G11C 7/00
[52] U.S. Cl. .................................... 365/189; 365/194
[58] Field of Search ............... 365/189, 190, 194, 195, 365/196, 230, 233

[56] References Cited

U.S. PATENT DOCUMENTS 3,866,061 2/1975 Wen et al. ........................ 365/194 X

Primary Examiner—Joseph A. Popek
Attorney, Agent, or Firm—Anthony J. Sarli, Jr.; Jeffrey Van Myers

[57] ABSTRACT

A write protection circuit for a control register includes a first logic circuit which provides a write enable signal to the control register in response to simultaneously receiving a register select signal, a write control signal and an enable signal. A second logic circuit provides the enable signal to the first logic circuit only until the first logic circuit first provides the write enable signal. The second logic circuit will also cease to provide the enable signal in response to a time-out signal. In response to either a reset signal or a test signal, the second logic circuit will again provide the enable signal.

11 Claims, 4 Drawing Figures

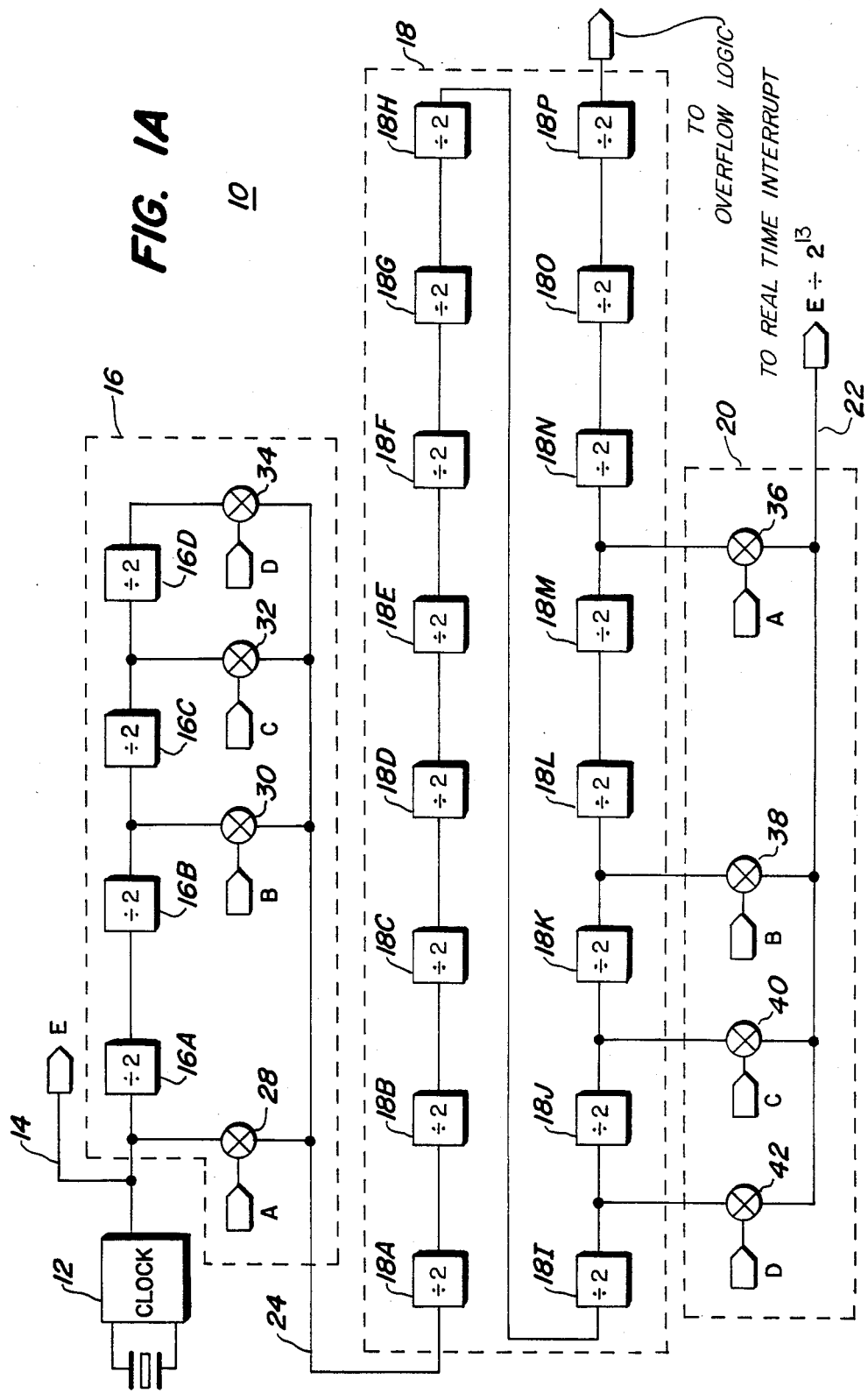

WRITE PROTECTION CIRCUIT AND METHOD FOR A CONTROL REGISTER

BACKGROUND OF THE INVENTION

The present invention relates, in general, to the field of microprocessors (MPUs) and microcomputers (MCUs) having integral system control registers. More particularly, the present invention relates to a write protection circuit and method for a control register which allows a write protected register to be written only once within a designated period of time after system reset.

In an MPU/MCU system, certain control registers and bits which determine system configuration would pose serious system integrity problems were they writeable, or under software control, during normal operation. An accidental write to these registers could change the system configuration resulting in a system failure. In the past, such configuration options in MPU/MCU systems were handled with separate mask set variations during fabrication of the devices or were otherwise not available. It would therefore be highly desirable to provide accessibility to such control registers to determine system configuration utilizing a single mask set yet maintaining a high degree of system security and integrity. Moreover, if it were possible to provide writeable control registers for various MPU/MCU system functions which afforded system security and integrity, numerous of such system functions could be placed under software control thus allowing for enhanced device operation.

SUMMARY OF THE INVENTION

It is therefore an object of the present invention to provide an improved write protection circuit and method for a control register.

It is further an object of the present invention to provide an improved write protection circuit and method for a control register which is readily implemented and integrated with an MPU/MCU.

It is still further an object of the present invention to provide an improved write protection circuit and method for a control register which allows flexibility of system configuration without mask set variation.

It is still further an object of the present invention to provide an improved write protection circuit and method for a control register which allows for software control of system configuration yet ensures system security and integrity.

The foregoing and other objects are achieved in the present invention wherein there is provided a write protection circuit for a control register having register and write select inputs thereto which comprises first logic means having as inputs the register and write select inputs, the logic means producing a write enable output to the control register. A second logic means is coupled to the write enable output for providing an additional enable/disable input to the first logic means. In operation, the second logic means will produce the disable input to the first logic means in response to the write enable output thereof. Also provided are time-out means for supplying a time-out input to the second logic means whereby the second logic means will produce the disable input to the first logic means in response to the time-out signal. The write protection circuit of the present invention may further include reset means for supplying a reset input to the second logic means whereby the second logic means will produce the enable input to the first logic means in response to the reset signal. Also provided are test means for supplying a test input to the second logic means whereby the second logic means will produce the enable input to the first logic means in response to the test signal.

In a specific embodiment of the present invention, there is provided a write protection circuit for a control register having register and write select inputs thereto which comprises a logic gate having as inputs the register and write select inputs, the logic gate providing a write enable output signal to the control register. Bistable logic means are coupled to the logic gate for providing an enable input to the logic gate in response to a first condition of the write enable output signal and a disable input to the logic gate in response to a second conditon of the write enable output signal. Reset means provide a reset function to the bistable logic means. Time-out means may also be provided for causing the bistable logic means to provide the disable input to the logic gate in response to a time-out signal. Test means may also be provided for causing the bistable logic means to produce the enable input to the logic gate in response to a test signal.

In accordance with a method of the present invention, a write enable signal to a control register may be provided by a method comprising the steps of furnishing enable, register and write select input signals to a first logic circuit. The first logic circuit output produces a write enable output signal in response to the enable, register and write select input signals. A portion of the write enable signal is then delayed for input to a second logic circuit which provides a disable input signal to the first logic circuit in response to the first occurrence of the write enable output signal. In a preferred embodiment, time-out means may also be provided for causing the second logic circuit to provide the disable input signal to the first logic circuit in response to a time-out signal. Reset means are provided to reset the second logic circuit to provide an enable input signal to the first logic circuit. Still further, there may be provided test means for causing the second logic circuit to provide the enable input signal to the first logic circuit in response to a test signal.

BRIEF DESCRIPTION OF THE DRAWINGS

The above-mentioned and other features and objects of the invention and the manner of attaining them will become more apparent and the invention itself will be best understood by reference to the following description of an embodiment of the invention taken in conjunction with the accompanying drawings, wherein:

FIG. 1A is a simplified logic flow diagram of a shareable prescaled timer which may be used with the present invention illustrating the counter chain, programmable prescaler and postscaler thereof for providing a clocking signal to a real-time interrupt function independent of the prescaler's programmably predetermined divisor;

DESCRIPTION OF A PREFERRED EMBODIMENT

Figure 2:
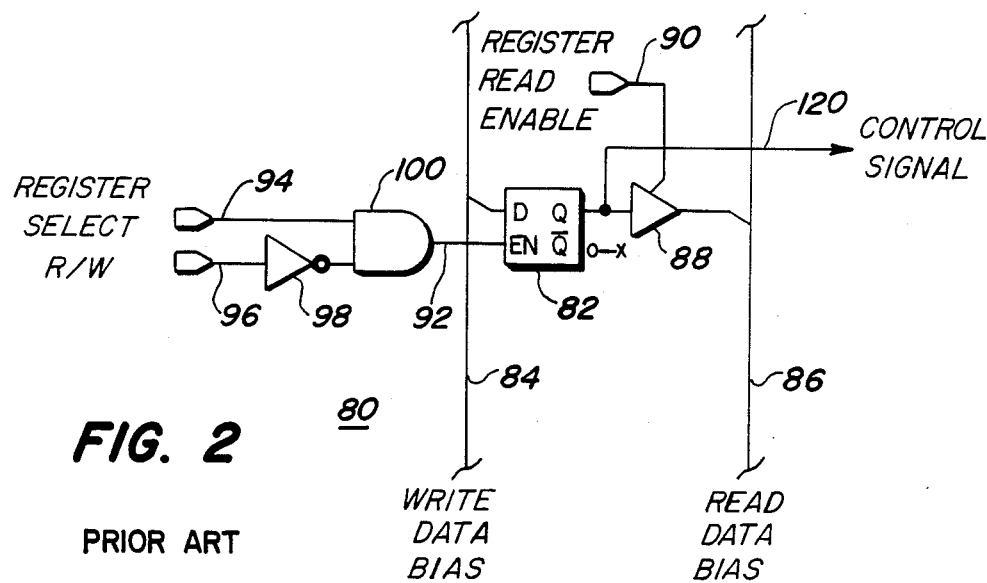
FIG. 2 is a simplified logic flow diagram of a conventional write enable circuit for a control register.

Referring to FIG. 2, a prior art write enable circuit 80 is shown. Write enable circuit 80, comprises in pertinent part, a dual input AND gate 100 utilized to enable register 82. Dual input AND gate 100 is operable in response to a logic 1 level on register select line 94 and a logic 0 level on R/$\overline{W}$ line 96, as inverted by inverter 98. The output of dual input AND gate 100 appearing on register write enable line 92 is connected to the enabling input of register 82. The data input to register 82 is connected to write data bus 84 while its Q output on control signal line 120 is connected to read data bus 86 through register read gate 88. Register read gate 88 is enabled by means of a signal appearing on register read enable line 90.

In operation, an address decode function would be performed which would supply a logic 1 level at register select line 94. Simultaneously, a logic 0 level appearing on R/$\overline{W}$ line 96 would cause dual input AND gate 100 to place a logic 1 level on register write enable line 92. This in turn, would enable register 82 and would cause whatever data was then currently on write data bus 84 to be written into register 82. Readout of the data stored within register 82 would occur upon receipt of a read enable signal on register read enable line 90 which would connect the Q output of register 82 to read data bus 86 through register read gate 88.

Figure 3:
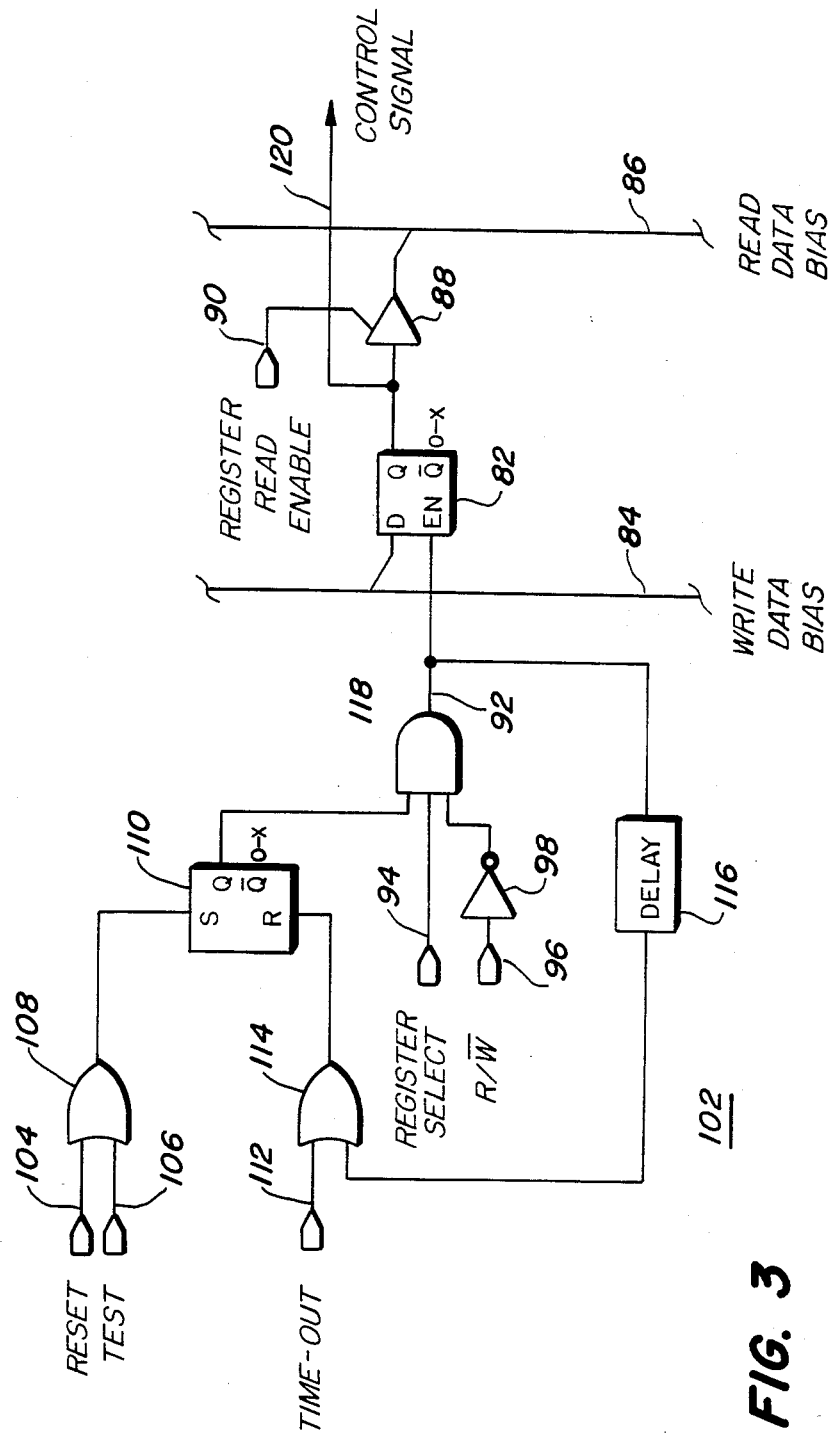
FIG. 3 is a simplified logic flow diagram of a write protected enable circuit for a control register in accordance with the present invention for use, for example, with the timer and control circuit of FIGS. 1A and 1B.

Referring additonally now to FIG. 3, a write protected enable circuit 102 in accordance with the present invention is shown. In the ensuing description of write protected enable circuit 102, the same elements to those above described with respect to write enable circuit 80 are identified with the same reference numerals and the foregoing description thereof shall suffice as a description herefor.

Write protected enable circuit 102 comprises a tri-input AND gate 118 having as inputs register select line 94 and R/$\overline{W}$ line 96 as applied through inverter 98. Register write enable line 92 is connected through a delay circuit 116 for input to OR gate 114. OR gate 114 has as an additional input a signal appearing on time-out line 112. The output of OR gate 114 is applied to the reset input of flip flop 110 having its Q output connected to the remaining input of tri-input AND gate 118. The set input of flip flop 110 is taken at the output of OR gate 108 having as inputs reset line 104 and test line 106.

In operation, a logic 1 level appearing at either reset line 104 or test line 106 will cause a logic 1 output of OR gate 108 to be applied to the set input of flip flop 110. This, in turn, will cause a logic 1 input to be applied to one input of tri-input AND gate 118. When a logic 1 level simultaneously appears on register select line 94 and a logic 0 level appears on R/$\overline{W}$ line 96, a logic 1 enabling output will appear on register write enable 92. This logic 1 level appearing on register write enable line 92 will cause the data appearing on write data bus 84 to be written into register 82. The same logic 1 level appearing on register write enable line 92 is also delayed for approximately one-half cycle by delay circuit 116 for input to OR gate 114 which will in turn cause a logic 1 level to appear at the reset input of flip flop 110 thus causing the Q output to go to a logic 0 level disabling tri-input AND gate 118. Similarly, a logic 1 level appearing on time-out line 112 for input to OR gate 114 will also cause a disabling logic 0 level to appear at the Q output of flip flop 110 whereby no write command to register 82 may be effectuated by a logic 1 level appearing on register select line 94 in concurrence with a logic 0 level appearing on R/$\overline{W}$ line 96. The signal appearing on time-out line 112 may be derived from timer 10 of FIG. 1A. It can be seen, therefore, that only one write command to register 82 may be effectuated by means of the write protected enable circuit 102. Moreover, this single write to register 82 may be effectuated after reset only for the time period thereby specified before a logic 1 level appears on time-out line 112. A logic 1 level appearing on reset line 104 or test line 106 will allow another write signal to be applied to register 82 by resetting flip flop 110.

In addition to its utilization with timer 10 of FIG. 1A, the write protected enable circuit 102 may also be used in conjunction with an MCU's internal mapping register, which is the subject matter of U.S. patent application No. 547,192 filed by James M. Sibigtroth and assigned to the assignee of the present invention. This register controls the position of internal random access memory (RAM) and register spaces in a system memory map. If this register could be accidentally written during normal operation, RAM might be moved which could cause system failure due to the loss of the stack. In addition, internal peripheral control registers might be moved such that the system would be unable to indicate the internal failure. The protection mechanism afforded by write-protected enable circuit 102 is a fundamental requirement to make software control of the mapping register practical. Write-protected enable circuit 102 may also be used in conjunction with a watchdog time-out rate. If such timeout rate is under software control, should these bits not be protected against accidental writes during normal operation, a system configured for a 16 millisecond timeout period, for example, might accidentally be reconfigured for a one second period resulting in a erroneous watchdog timeout and exposing the system to longer vulnerability to erroneous operation. Other uses for write protection enable circuit 102 will be apparent to those skilled in the art.

With reference to FIG. 1A, a timer 10 is shown for exemplary use with the write protection circuit and method of the present invention. Timer 10 is the subject of U.S. patent application Ser. No. 548,177 filed concurrently herewith by James M. Sibigtroth and David Rivera and assigned to the assignee of the present invention.

Timer 10 comprises, in pertinent part, a clock generator 12 for providing a high frequency output on E clock line 14. The high frequency clocking signal appearing on E clock line 14 is input to a prescaler 16. Prescaler 16 comprises a number of divider stages 16A, 16B, 16C and 16D which may comprise conventional flip flops, as well as transmission gates 28, 30, 32 and 34 which allow for the clocking signal on E clock line 14, or any of various prescaled clocking signals from prescaler 16, to be applied to counter chain input line 24. Specifically, when transmission gate 28 is enabled the output of clock generator 12 on E clock line 14 is applied directly to counter chain input line 24 such that the frequency input to counter chain 18 is E. When transmission gate 30 is enabled, divider stages 16A and 16B are inserted between E clock line 14 and counter chain input line 24, thereby resulting in a frequency input to counter chain 18 of E/4. Similarly, when transmission gate 32 is enabled, the frequency appearing on E clock line 14 is divided by divider stages 16A, 16B and 16C such that a frequency of E/8 is applied to counter chain input line 24. In like manner, enabling transmission gate 34 applies a frequency of E/16 to counter chain input line 24.

Counter chain 18 comprises a plurality of divider stages 18A, 18B, 18C, 18D, 18E, 18F, 18G, 18H, 18I, 18J, 18K, 18L, 18M, 18N, 18O and 18P which may comprise conventional flip flops. As can be seen, counter chain 18 supplies a fixed frequency divide function of $E/2^{16}$ although an output may be taken after certain of the various divider stages for input to postscaler 20. One output of counter chain 18 at the output of divider stage 18I is applied as an input to transmission gate 42 of postscaler 20. Similarly the outputs of divider stages 18J, 18K and 18M are applied respectively as inputs to transmission gates 40, 38 and 36 respectively. Enabling any of transmission gates 42, 40, 38 and 36, which together comprise a postscaler 20, couple a selected output of counter chain 18 to $E/2^{13}$ line 22. The output of counter chain 18 appearing at the output of divider stage 18P is used to provide a clocking signal to a timer overflow detection circuit based on the setting of prescaler 16 and the fixed divide function of counter chain 18. $E/2^{13}$ line 22 may be utilized in conjunction with a further programmable divider independent of control PR1 and PR0 for input to a real time interrupt circuit.

Figure 1B:
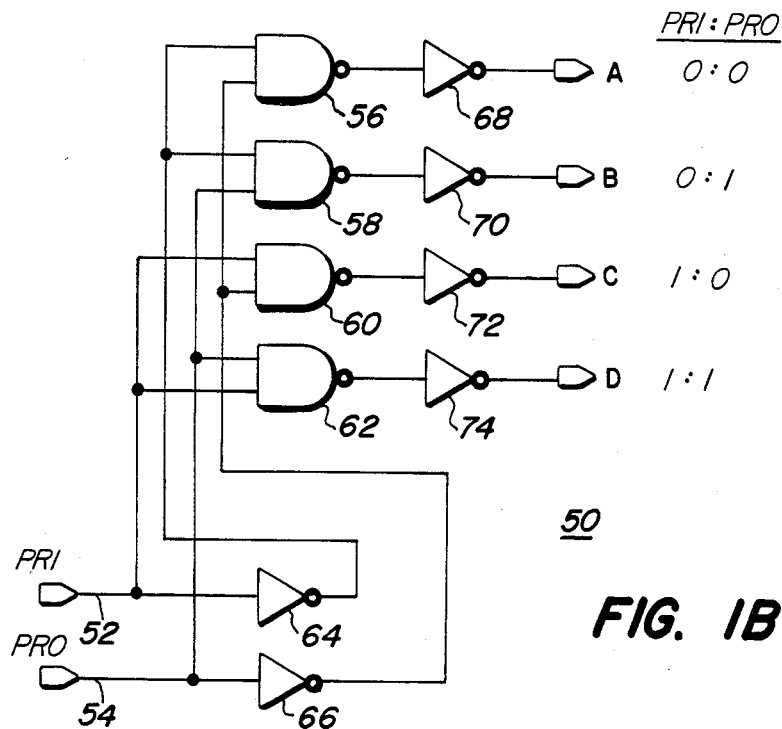
FIG. 1B is a simplified logic flow diagram of a system for selection of the programmable prescaler and corresponding postscaler functions of the shareable prescaled timer of FIG. 1A in response to control bits PR1 and PR0.

Referring additionally now to FIG. 1B, a control circuit 50 for use with timer 10 is shown. Control circuit 50 operates in response to two control bits, PR1 and PR0 appearing respectively on PR1 control bit line 52 and PR0 control bit line 54. PR1 control bit line 52 is applied as an input to inverter 64 and one input of NAND gates 60,62. PR0 control bit line 54 is supplied as input to inverter 66, one input to NAND gate 58 and the remaining input to NAND gate 62. The output of inverter 64 is connected to one input of NAND gate 56 and the remaining input of NAND gate 58. In like manner, the output of inverter 66 is applied to the remaining inputs of NAND gates 56,60.

Outputs from NAND gates 56, 58, 60 and 62 are applied respectively through inverters 68, 70, 72 and 74 for application to timer 10. In other applications it may be preferable to combine the function of NAND gates 56, 58, 60 and 62 with inverters 68, 70, 72 and 74 respectively by using AND gates. As illustrated, the output of inverter 68, corresponding to an input to control circuit 50 of PR1=0 and PR0=0 is applied to transmission gates 28 and 36. The output of inverter 70 corresponding to control bit inputs to control circuit 50 of PR1=0 and PR0=1 is applied to transmission gates 30,38. Likewise, the output of inverter 72 corresponding to control bit inputs to control circuit 50 of PR1=1 and PR0=0 is applied to transmission gates 32,40. Similarly, the output of inverter 74 corresponding to control bit inputs to control circuit 50 of PR1=1 and PR0=1 is applied to transmission gates 34,42.

In operation, it is desired that the output frequency appearing on $E/2^{13}$ line 22 be independent of the prescaled value set by prescaler 16. Thus, for each divisor inserted between E clock line 14 and counter chain 18 input line 24, a correspondingly smaller divisor function is selected from counter chain 18 by postscaler 20 between a counter chain 18 output and $E/2^{13}$ line 22.

For example, should a logic 1 level appear on PR1 control bit line 52, and a logic 0 level appear on PR0 control bit line 54, a logic 1 level will appear at the output of inverter 72. This logic 1 level will be applied to transmission gates 32 and 40 of timer 10. In this manner, the clocking frequency appearing on E clock line 14 divided by divider stages 16A, 16B and 16C will be applied to counter chain input line 24. Thus, prescaler 16 will provide a divide function of E/8 or $E/2^3$. Counter chain 18, as shown, has a fixed frequency divide function of $E/2^{16}$, although outputs may be selected at $E/2^9$, $E/2^{10}$, $E/2^{11}$ or $E/2^{13}$. Thus, in this example, the frequency appearing as input to postscaler 20 at transmission gate 40 will be a frequency of $E/2^3$ times the counter chain 18 value of $E/2^{10}$ or $E/2^{13}$. In this manner, it can be seen that regardless of the prescale value selected for prescaler 16, a corresponding compensation function occurs with respect to postscaler 20 thus ensuring that the frequency on $E/2^{13}$ line 22 remains a constant.

In utilization of the above described timer 10 and associated control circuit 50, it is imperative that the control bits PR0/PR1 which set the prescaler 16 and postscaler 20 division factors not be writeable during normal system operation. For example, during operation it would be possible to enter a situation where the signal appearing on the output of divider stage 18I through transmission gate 42 were a logic 1 while the output of divider stage 18M, for example, were a logic 0. By then writing to the two control bits PR0/PR1, it would be possible to switch the signal on $E/2^{13}$ line 22 by enabling transmission gate 36 connecting it to the output of divider stage 18M, thus giving an erroneous signal on $E/2^{13}$ line 22. By use of the write protection circuit and, method of the present invention, software control of timer 10 is made possible yet a write to control bits PR0/PR1 is allowed only once, and only once within a certain specified time after system reset. In this manner, control bits PR0/PR1 may not be written during normal system operation.

What has been provided therefore is an improved write protection circuit and method for a control register which is readily implemented and integrated with an MPU/MCU. The write protection circuit and method of the present invention allows flexibility of system configuration without mask set variations and allows for software control of system configuration yet ensures system security and integrity.

While there have been described above the principles of the invention in conjunction with specific apparatus, it is to be clearly understood that this description is made only by way of example and not as a limitation to the scope of the invention.

I claim:

1. A write protection circuit for a control register, comprising:
   first logic means for receiving a register select signal, a write control signal and an enable signal, said first logic means providing a write enable signal to said control register in response to simultaneously receiving said register select, write control and enable signals; and
   second logic means for receiving said write enable signal, said second logic means providing said enable signal only until said first logic means first produces said write enable signal;

whereby said second logic means will enable said first logic means to provide said write enable signal only once.

2. The write protection circuit of claim 1 further comprising:
time-out means for selectively providing a time-out signal;
said second logic means being further characterized as receiving said time-out signal and as ceasing to provide said enable signal to said first logic means in response to said time-out signal.

3. The write protection circuit of claim 1 further comprising:
reset means for selectively providing a reset signal;
said second logic means being further characterized as providing said enable signal to said first logic means in response to said reset signal.

4. The write protection circuit of claim 1 further comprising:
test means for selectively providing a test signal;
said second logic means being further characterized as providing said enable signal to said first logic means in response to said test signal.

5. The write protection circuit of claim 1 wherein said first logic means comprises an AND gate.

6. The write protection circuit of claim 1 wherein said second logic means comprises a flip flop.

7. The write protection circuit of claim 1 further comprising a delay circuit interposed between the output of said first logic means and the input of said second logic means, for delaying the receipt by said second logic means of the write enable signal provided by said first logic means.

8. A method for providing a write enable signal to a control register comprising the steps of:
receiving a register select signal, a write control signal and an enable signal, and providing a write enable signal to said control register in response to simultaneously receiving said register select, write control and enable signals; and
receiving said write enable signal, and providing said enable signal only until said write enable signal is received;
whereby said write enable signal is provided only once.

9. The method of claim 8 further comprising the step of:
selectively providing a time-out signal;
said step of providing said enable signal being further characterized as receiving said time-out signal and as ceasing to provide said enable signal in response to said time-out signal.

10. The method of claim 8 further comprising the step of:
selectively providing a reset signal;
said step of providing said enable signal being further characterized as providing said enable signal in response to said reset signal.

11. The method of claim 8 further comprising the step of:
selectively providing a test signal;
said step of providing said enable signal being further characterized as providing said enable signal in response to said test signal.

* * * * *